(12) United States Patent
Choi

(10) Patent No.: US 6,337,245 B1
(45) Date of Patent: Jan. 8, 2002

(54) METHOD FOR FABRICATING FLASH MEMORY DEVICE AND FLASH MEMORY DEVICE FABRICATED THEREBY

(75) Inventor: Jeong-hyuk Choi, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/571,746

(22) Filed: May 15, 2000

(30) Foreign Application Priority Data

May 17, 1999 (KR) .............................. 99-17600

(51) Int. Cl.⁷ .......................................... H01L 21/8242
(52) U.S. Cl. .................. 438/258; 438/264; 438/588
(58) Field of Search .............................. 438/258, 264, 438/587, 588, 594

(56) References Cited

U.S. PATENT DOCUMENTS 5,656,527 A  * 8/1997 Choi et al. ................... 438/258
6,056,783 A  * 5/2000 Yoo et al. .................... 438/587
6,180,457 B1 * 1/2001 Shin et al. ................... 438/258

FOREIGN PATENT DOCUMENTS

JP          6-120512      *  4/1994

* cited by examiner

Primary Examiner—Chandra Chaudhari
(74) Attorney, Agent, or Firm—Volentine Francos, PLLC

(57) ABSTRACT

A method for fabricating a flash memory device and a flash memory device fabricated by this method are provided. A device isolation film for defining an active region is formed over a predetermined region of a semiconductor substrate and a tunnel insulating film is formed over the surface of the active region. A plurality of floating gate patterns crossing the device isolation film and the active region are formed in parallel. Each of the plurality of floating gate patterns comprises a conductive layer pattern and a capping layer pattern, which are sequentially stacked. An impurity region of a different conductivity type from that of the semiconductor substrate is formed over the active region between the plurality of floating gate patterns. An insulating film pattern filling up a region between the plurality of floating gate patterns is formed. A floating gate and an isolated capping layer pattern are sequentially formed over the active region crossing each floating gate pattern by selectively etching a predetermined region of each floating gate pattern to expose the device isolation film crossing each floating gate pattern. The floating gate is then exposed by removing the isolated capping layer pattern. A plurality of word lines are formed over the exposed floating gate and the exposed device isolation film in a direction in which the plurality of word lines cross the device isolation film and the active region. Each of the plurality of word lines is insulated from the exposed floating gate by an inter-gate dielectric film.

10 Claims, 13 Drawing Sheets

METHOD FOR FABRICATING FLASH MEMORY DEVICE AND FLASH MEMORY DEVICE FABRICATED THEREBY

This application relies for priority upon Korean Patent Application No. 99-17600, filed on May 17, 1999, the contents of which are herein incorporated by reference in their entirety.

BACKGROUND OF THE INVENTION

The present invention relates to a method for fabricating a semiconductor device and a resulting semiconductor device fabricated by this method. More particularly, the present invention relates to a method for fabricating a flash memory device and a resulting flash memory device fabricated by such a method.

In contrast to a random access memory (RAM) device, a flash memory device, which is a type of a read only memory (ROM), does not lose information stored in its memory cells, even if its power supply is interrupted. Because of this characteristic, flash memory devices are being widely adopted in memory cards for computers and the like.

A unit cell of a flash memory device has the same structure as that of a memory cell of an erasable programmable ROM (EPROM) device or an electrically erasable and programmable ROM (EEPROM) device. In other words, a flash memory cell includes a tunnel oxide film, a floating gate, an inter-gate dielectric film, and a control gate electrode serving as a word line, which are sequentially stacked on a channel region.

FIG. 1 is a layout showing part of a cell array of a conventional NAND-type flash memory device. Referring to FIG. 1, two active regions ACT are disposed in parallel. One string selection line SSL, a plurality of word lines $WL_1$, $WL_2$, ..., and $WL_n$, and one ground selection line GSL are also disposed in parallel, but oriented to cross the two active regions ACT in a perpendicular direction. A contact CT exposing each active region ACT is placed on each active region ACT adjacent to the string selection line SSL.

Bit lines $BL_1$ and $BL_2$, which are electrically connected to respective active regions ACT via each contact CT, run over each active region ACT. The active regions ACT adjacent to the ground selection line GSL are extended in a direction parallel to the ground selection line GSL so as to serve as a common source line CSL.

A floating gate isolation pattern FGI is disposed in a region between the two active regions ACT, i.e., to serve as a device isolation region. The floating gate isolation pattern FGI is disposed such that it crosses only the plurality word lines $WL_1$, $WL_2$, ..., and $WL_n$ placed between the string selection line SSL and the ground selection line GSL.

A single memory cell, i.e., a single cell transistor, is formed at the intersection of each word line $WL_1$, $WL_2$, ..., and $WL_n$ and each active region ACT. A gate of each cell transistor has a structure in which a tunnel oxide film, a floating gate FG (the hatched portion in FIG. 1), an inter-gate dielectric film, and a control gate electrode corresponding to a word line are sequentially stacked on the active region ACT.

FIGS. 2A, 3A and 4A are sectional views taken along the line A–A' of FIG. 1, to explain a method of fabricating the conventional flash memory device. FIGS. 2B, 3B and 4B are sectional views taken along the line B–B' of FIG. 1, also to explain a method for fabricating the conventional flash memory device.

Referring to FIGS. 2A and 2B, a device isolation film 3 is formed in a predetermined region of a semiconductor substrate 1, using a photo mask on which the active region ACT of FIG. 1 is engraved. A thin tunnel oxide film 5 having a thickness of 100 Å or less is formed on the surface of the active region between the device isolation films 3. A first conductive layer, e.g., a doped polysilicon film, is formed on the entire surface of the semiconductor substrate on which the tunnel oxide film 5 has been formed. A first conductive layer pattern 7 for exposing a predetermined region of the device isolation film 3 between the adjacent active regions is formed by patterning the first conductive layer using a photo mask on which the floating gate isolation pattern FGI is engraved.

Referring to FIGS. 3A and 3B, an inter-gate dielectric film 9 and a second conductive layer are sequentially formed on the entire surface of the semiconductor substrate on which the first conductive pattern 7 has been formed. The second conductive layer, the inter-gate dielectric film 9 and the first conductive layer pattern 7 are consecutively patterned using a photo mask on which the plurality of word lines $WL_1$, $WL_2$, ..., and $WL_n$ of FIG. 1 are engraved. Accordingly, the plurality of word lines $WL_1$, $WL_2$, ..., and $WL_n$, which are parallel to one another, are formed and, simultaneously, the floating gate FG of FIG. 1 is formed on the active region crossing each word line $WL_1$, $WL_2$, ..., and $WL_n$.

At this time, the inter-gate dielectric film 9 remaining at the sidewalls of the first conductive layer pattern 7 between the plurality of word lines $WL_1$, $WL_2$, ..., and $WL_n$ should be completely removed. If a part of the inner-gate dielectric film 9 remains on the sidewalls of the first conductive layer pattern 7 between the plurality of word lines $WL_1$, $WL_2$, ..., and $WL_n$, the first conductive layer pattern 7 between the plurality of word lines $WL_1$, $WL_2$, ..., and $WL_n$ is also not completely removed, thereby forming a stringer of the first conductive material. The stringer can electrically connect adjacent floating gates FG to each other. This can cause a problem in which an unselected second cell is also programmed when a selected first cell is being programmed.

As a result of this, the inter-gate dielectric film 9, which is exposed after the second conductive layer is etched, should be over etched. This results in a recess of the device isolation film 3 exposed between the plurality word lines $WL_1$, $WL_2$, ..., and $WL_n$, as shown in FIG. 3B, thereby reducing the thickness of the device isolation film 3. Of course, the recess phenomenon in the device isolation film 3 becomes more serious as the first conductive layer pattern 7 becomes thicker, requiring greater etching to remove.

Referring to FIGS. 4A and 4B, impurities of a different conductivity type to that of the semiconductor substrate 1 are implanted into the active region exposed between the plurality of word lines $WL_1$, $WL_2$, ..., and $WL_n$, thereby forming source and drain regions $SD_1$ and $SD_2$, respectively, for each cell transistor. At this time, as shown in FIGS. 4A and 4B, the impurities may also be implanted into the semiconductor substrate 1 under the recessed device isolation film 3, thereby forming a field inversion layer FI. Accordingly, an electrical isolation characteristic between adjacent source and drain regions $SD_1$ and $SD_2$ is reduced so that a leakage current $I_L$ may flow when different voltages are applied to the source and drain regions $SD_1$ and $SD_2$. Consequently, when selectively programming one cell of the flash memory device fabricated according to the conventional technology described above, it is possible that an unselected memory cell may also be programmed.

With reference to FIGS. 1, 4A, and 4B, general conditions required for programming a selected memory cell S will now be described. Primarily, the voltage of 0V is applied to a selected bit line connected to a string including the selected memory cell S, e.g., the first bit line $BL_1$, and a program inhibition voltage $VP_{pi}$ that is close to a power supply voltage $V_{cc}$ is applied to the unselected bit lines, e.g., the second bit line $BL_2$. A program voltage $V_p$ of about 15V is applied to a selected word line that serves as a control gate electrode of the selected memory cell S, e.g., the second word line $WL_2$. A pass voltage $V_{pass}$ of about 8V is then applied to unselected word lines $WL_1, \ldots,$ and $WL_n$ other than the selected word line ($WL_2$ in this example) and the string selection line SSL. The voltage of 0V is applied to the ground selection line GSL, the common source line CSL, and the semiconductor substrate 1.

As describe above, once a predetermined voltage is applied to each control line for the purpose of programming the selected memory cell, the voltage of 0V is induced to the source and drain region $SD_1$ and a channel region $CH_1$ of the selected memory cell S and the program inhibition voltage $V_{pi}$ is induced to the source and drain region $SD_2$ and a channel region $CH_2$ of a unselected memory cell N, which is adjacent to the selected memory cell S and which shares the second word line $WL_2$ with the selected memory cell S. At this time, if the width and thickness of the device isolation film 3 do not both exceed respective predetermined values, a parasitic field transistor between the unselected memory cell N and the selected memory cell S may be turned on by the high program voltage $V_p$ applied to the second word line $WL_2$.

As a result of this parasitic field transistor, a leakage current $I_a$ may flow from the channel region $CH_2$ of the unselected memory cell N to the channel region $CH_1$ of the selected memory cell S. Furthermore, in a case where the field inversion layer FI is formed under the device isolation film 3 between the source and drain region $SD_2$ of the unselected memory cell N and the source and drain region $SD_1$ of the selected memory cell S, another leakage current $I_b$ may flow between the source and drain regions $SD_2$ and $SD_1$. As a result, a ground voltage may be induced in the channel region $CH_2$ of the unselected memory cell N, thereby causing the unselected memory cell N to be programmed.

According to the conventional technology as described above, a device isolation characteristic between a selected memory cell and an unselected memory cell is reduced so that even the unselected memory cell is programmed. Furthermore, the conventional technology has a limitation in that it is harder to reduce the width and thickness of a device isolation film for the purpose of increasing the integration of a flash memory device.

SUMMARY OF THE INVENTION

It is an object of the present invention to provide a method for fabricating a flash memory device for preventing a device isolation film between adjacent memory cells from being recessed even if a floating gate of the memory cell is thicker than the device isolation film.

It is another object of the present invention to provide a flash memory device having an improved coupling ratio for each memory cell and an improved device isolation characteristic between adjacent memory cells.

To achieve the first object of the present invention, a method is provided for fabricating a flash memory device. This method comprises forming a device isolation film over a predetermined region of a semiconductor substrate to define a plurality of active regions, forming a tunnel insulating film over the active regions, forming a plurality of floating gate patterns in parallel, such that they cross the device isolation film and the active regions, each of the plurality of floating gate patterns comprising a conductive layer pattern and a capping layer pattern that are sequentially stacked, forming a plurality of impurity regions of a different conductivity type from that of the semiconductor substrate in a portion of the active region between the plurality of floating gate patterns, forming an insulating film pattern to fill up regions between the plurality of floating gate patterns, forming a plurality of floating gates and isolated capping layers that are sequentially stacked over respective active regions by selectively etching a predetermined region of each floating gate pattern to expose a portion of the device isolation film beneath each floating gate pattern, exposing each floating gate by removing the isolated capping layers, forming an inter-gate dielectric film over the exposed floating gate and the exposed device isolation film and forming a plurality of word lines over the inter-gate dielectric film, such that each word line crosses the device isolation film and the active regions. The impurity region is preferably formed by implanting phosphorus (P) or arsenic (As) ions at a dose of between $1 \times 10^{13}$ ion atoms/cm$^2$ to $1 \times 10^{14}$ ion atoms/cm$^2$.

The method may further comprise forming spacers at sidewalls of the floating gate patterns. The method may then further comprise forming a high concentration impurity region by implanting arsenic (As) ions at a dose of between $1 \times 10^{15}$ ion atoms/cm$^2$ to $5 \times 10_{15}$ ion atoms/cm$^2$ in the impurity region, using the spacers and the floating gate pattern as an ion-implantation mask, after forming the spacers.

The forming of the insulating film pattern may comprise forming an insulating film over the impurity regions, and blanket-etching the insulating film until the capping layer pattern in the floating gate pattern is exposed.

The method may further comprise forming a channel stop impurity region by implanting impurities of the same conductivity type as the semiconductor substrate in the semiconductor substrate under the exposed device isolation film, after forming the floating gates and isolated capping layers.

The forming of the plurality of word lines may comprise forming a conductive layer over portions of the semiconductor substrate from which the isolated capping layers have been removed, and forming a plurality of conductive layer patterns insulated by the inter-gate dielectric film over the floating gate and the device isolation film adjacent to the floating gate by patterning the conductive layer and the inter-gate dielectric film to expose the insulating film pattern. The plurality of conductive layer patterns are preferably formed in parallel in a direction in which the plurality of conductive layer patterns cross the device isolation film.

The conductive layer preferably comprises tungsten polycide.

The forming of the plurality of word lines may comprise forming a polysilicon film over portions of the semiconductor substrate from which the isolated capping layers have been removed, forming a plurality of polysilicon patterns insulated by the inter-gate dielectric film over the floating gate and the device isolation film adjacent to the floating gate by blanket-etching the polysilicon film until the insulating film pattern is exposed, wherein the plurality of polysilicon patterns are formed in parallel in a direction in which the plurality of polysilicon patterns cross the device isolation film, and selectively forming a refractory metal silicide film over the plurality of polysilicon patterns.

The method may further comprise forming an interlayer insulating film over the semiconductor substrate and the plurality of word lines, forming a bit line contact hole exposing a predetermined region of the active region by patterning the interlayer insulating film, and forming a bit line over the interlayer insulating film, the bit line being electrically connected to the exposed active region through the bit line contact hole.

To achieve the second object of the present invention, a flash memory device is provided, comprising a pair of device isolation films formed in a predetermined region of a semiconductor substrate to define an active region, a tunnel insulating film formed over the active region, a floating gate covering a predetermined area of the tunnel insulating film and extending over the edges of the pair of device isolation films adjacent to the predetermined area of the tunnel insulating film, the floating gate being thicker than the device isolation film, an inter-gate dielectric film formed over the floating gate, and a word line formed over the inter-gate dielectric film, the word line serving as a control gate electrode.

The center of the device isolation films are no thinner than the edges of the pair of device isolation films overlapped with the floating gate.

According to the present invention described above, a device isolation film between a plurality of floating gates maintains its initial thickness even if the floating gate is thicker than the device isolation film. Therefore, not only is an area in which a word line is overlapped with the floating gate increased but also the device isolation characteristic between adjacent cells is prevented from being reduced.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown.

FIGS. 5A through 10C are sectional views for explaining a method for fabricating a flash memory device according to a first preferred embodiment of the present invention. FIGS. 5A, 6A, 7A, 8A, 9A and 10A are sectional views taken along the line A–A' of FIG. 1. FIGS. 5B, 6B, 7B, 8B, 9B and 10B are sectional views taken along the line B–B' of FIG. 1. FIGS. 5C, 6C, 7C, 8C, 9C and 10C are sectional views taken along line C–C' of FIG. 1.

Figure 1:
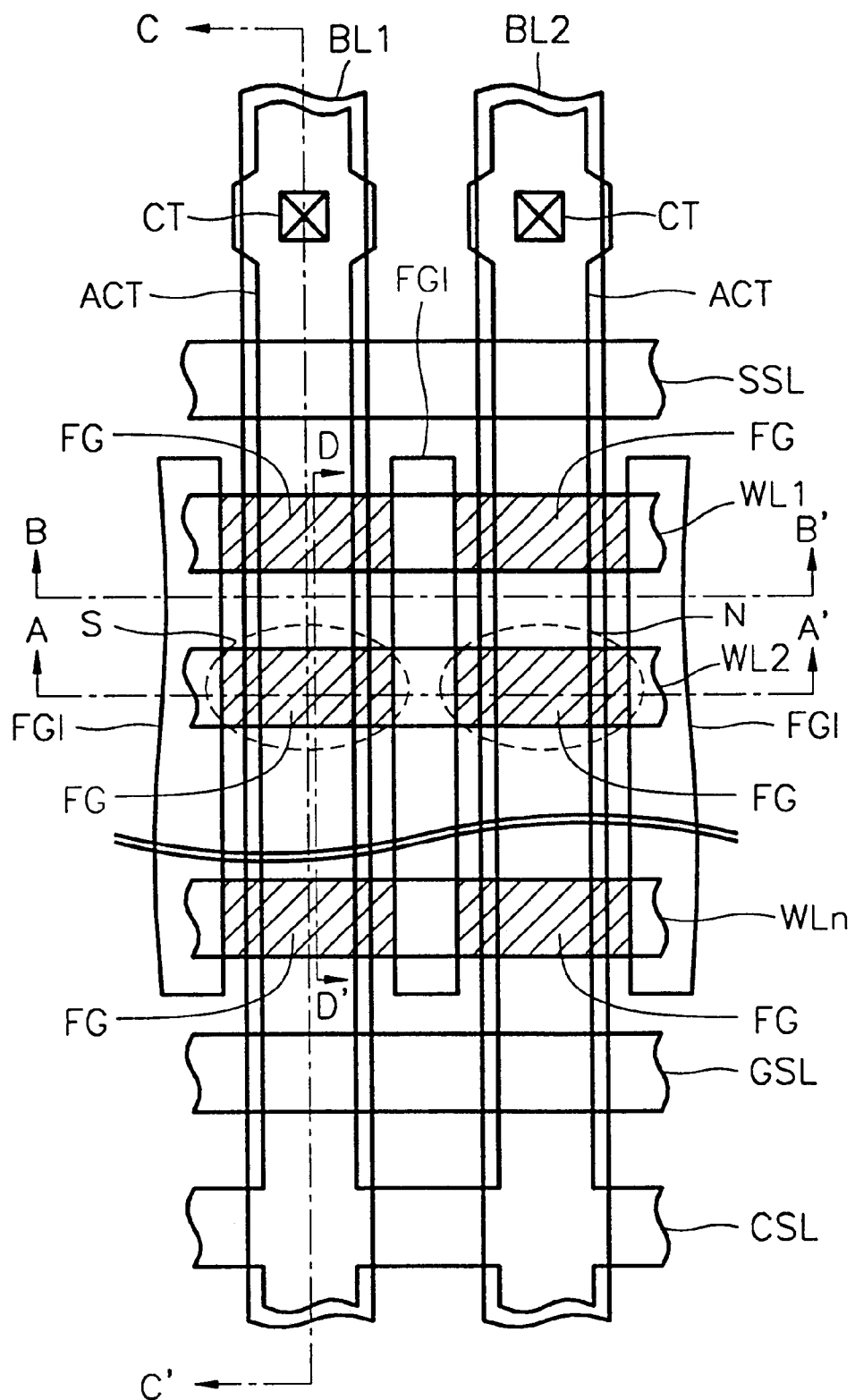
FIG. 1 is a layout showing a part of a cell array of a NAND-type flash memory device adopted in both the prior art and preferred embodiments of the present invention.
Figure 2A:
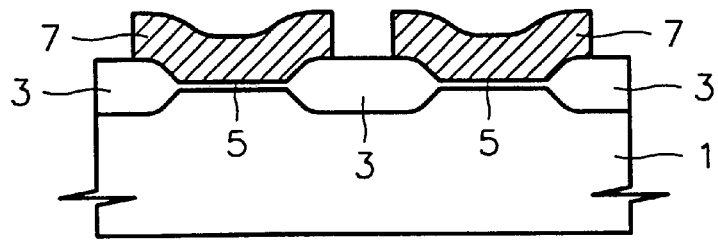
FIGS. 2A, 3A and 4A are sectional views taken along the line A–A' of Fig. 1, for explaining a conventional method for fabricating a NAND-type flash memory device.
Figure 2B:
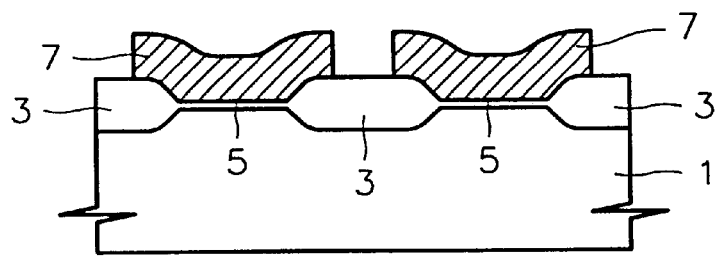
FIGS. 2B, 3B and 4B are sectional views taken along the line B–B' of FIG. 1, for explaining the conventional method for fabricating the NAND-type flash memory device.
Figure 3A:
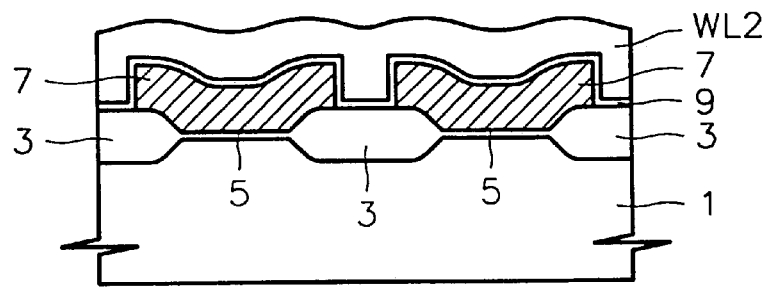
Figure 3B:
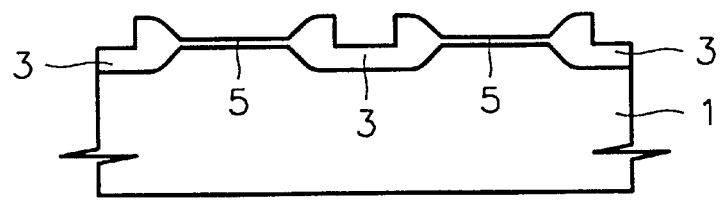
Figure 4A:
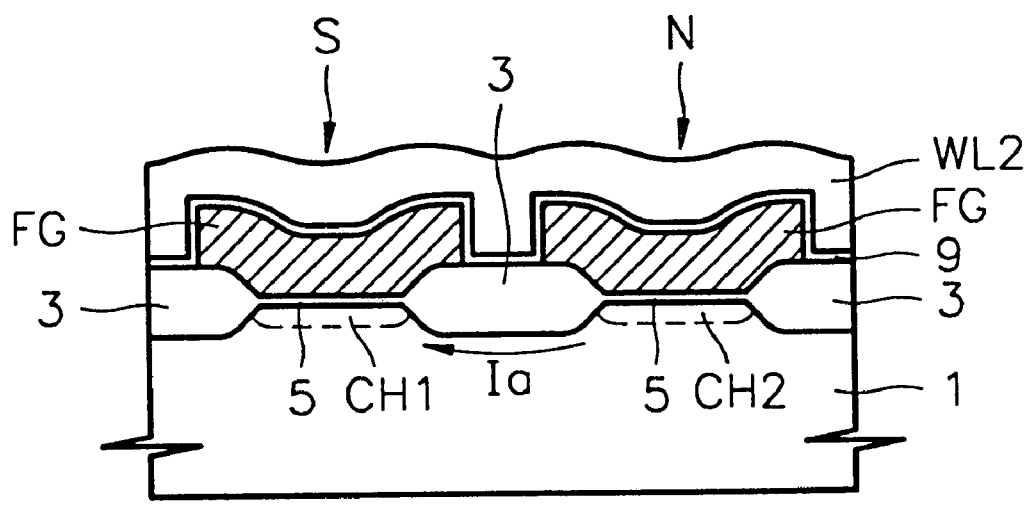
Figure 4B:
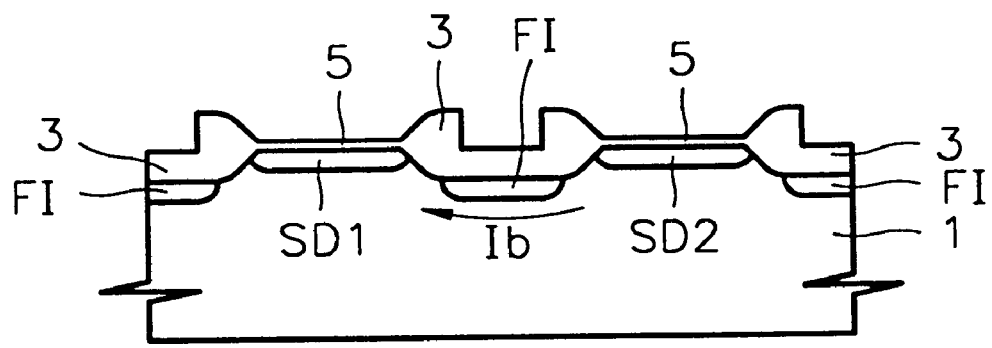
Figure 5A:
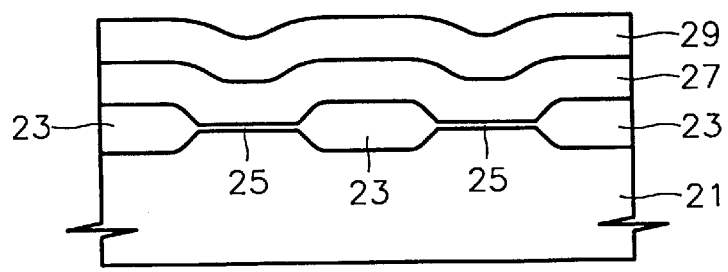
FIGS. 5A, 6A, 7A, 8A, 9A and 10A are sectional views taken along the line A–A' of FIG. 1, for explaining a method for fabricating a NAND-type flash memory device according to a first preferred embodiment of the present invention.
Figure 5B:
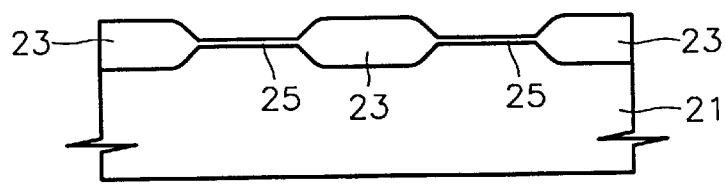
FIGS. 5B, 6B, 7B, 8B, 9B and 10B are sectional views taken along the line B–B' of FIG. 1, for explaining the method for fabricating the NAND-type flash memory device according to the first preferred embodiment of the present invention.
Figure 5C:
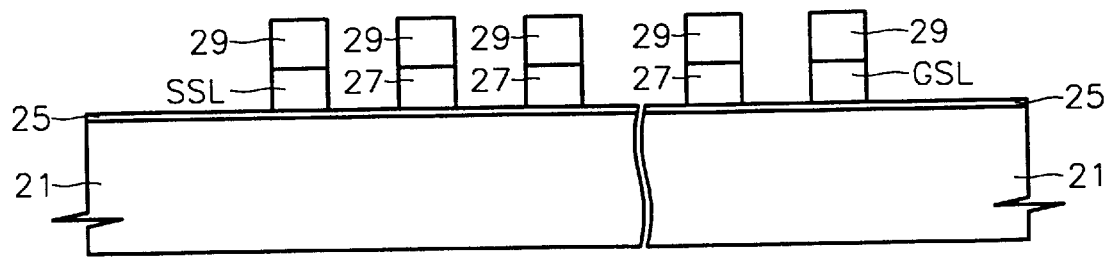
FIGS. 5C, 6C, 7C, 8C, 9C and 10C are sectional views taken along the line C–C' of FIG. 1, for explaining the method for fabricating the NAND-type flash memory device according to the first preferred embodiment of the present invention.

Referring to FIGS. 5A through 5C, a device isolation film 23 is formed over a predetermined region of a semiconductor substrate 21, using a photo mask on which the active region ACT of FIG. 1 is engraved. The device isolation film 23 is preferably formed of a field oxide film of about 3000 Å thickness through a device isolation process such as a local oxidation of silicon (LOCOS) process or a polysilicon buffered LOCOS (PBL). Preferably, the semiconductor substrate 21 is a P-well or a P-type semiconductor substrate.

A thin tunnel insulting film 25, e.g., a silicon oxide film or a silicon oxynitride film, preferably having a thickness of 100 Å or less, is then formed over the active region between the device isolation films 23. A conductive layer and a capping layer are then formed sequentially over the entire surface of the semiconductor substrate including the tunnel insulating film 25. Preferably, the conductive layer is a polysilicon film of about 4000 Å thickness and the capping layer is a silicon nitride film of about 4500 Å thickness.

The capping layer and the conductive layer are then consecutively patterned using a single photo mask on which the plurality of word lines $WL_1$, $WL_2$, . . . , and $WL_n$, the string selection line SSL and the ground selection line of FIG. 1 are engraved, thereby forming a plurality of floating gate patterns crossing the device isolation film 23 and the tunnel insulating film 25, a single string selection gate pattern, and a single ground selection gate pattern. The plurality of floating gate patterns, the single string selection gate pattern, and the single ground selection gate pattern are formed in parallel and cross the device isolation film 23 and the tunnel insulating film 25.

The plurality of floating gate patterns, the string selection gate pattern, and the ground selection gate pattern are each comprise a conductive layer pattern 27 and a capping layer pattern 29 stacked over the conductive layer pattern 27. In particular, the portions of the conductive layer patterns 27 that comprise the string selection gate pattern and the ground selection gate pattern correspond to the string selection line SSL and the ground selection line GSL of FIG. 1, respectively.

Figure 6A:
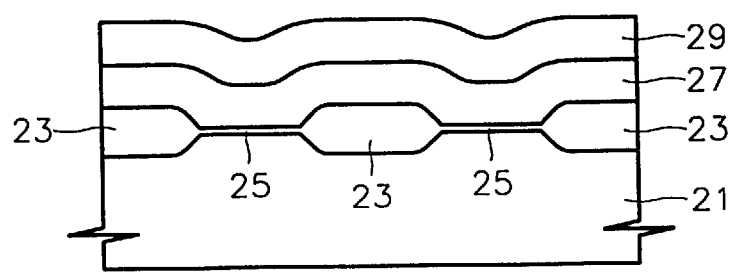
Figure 6B:
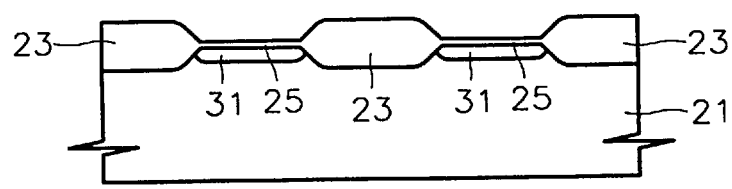
Figure 6C:
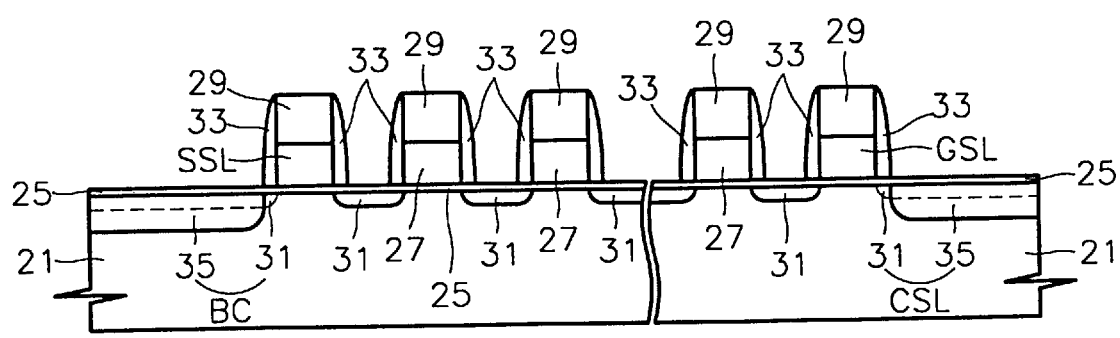

Referring, to FIGS. 6A to 6C, impurities of a different conductivity type from the semiconductor substrate 21, e.g., phosphorus (P) ions or arsenic (As) ions, are implanted into the entire surface of the semiconductor substrate including the plurality of floating gate patterns, the single selection gate pattern, and the single ground selection gate pattern, preferably at a dose of between $1\times10^{14}$ ion atoms/cm$^2$ and $1\times10^{14}$ ion atoms/cm$^2$ thereby forming, an impurity region 31, i.e., a low concentration impurity region, in an active region at each side of each gate pattern.

A CVD oxide film, which has an excellent step coverage, is then formed over the entire surface of the semiconductor substrate including the impurity region 31. The CVD oxide film is then anisotropically etched, to form spacers 33 at the sidewalls of the plurality of floating gate patterns, single string selection gate pattern, and ground selection gate pattern. A photoresist pattern (not shown) is formed covering the region between the string selection gate pattern and the ground selection gate pattern. Impurities of the same conductivity type as the impurity region 31, e.g., arsenic (As) ions, are then implanted into the entire surface of the semiconductor substrate, preferably at a dose between $1\times10^{15}$ ion atoms/cm$^2$ and $5\times10^{15}$ ion atoms/cm$^2$, thereby forming high concentration impurity regions 35 in the active region adjacent to the string selection gate pattern and the active region adjacent to the ground selection gate pattern. The impurity region 35 may be formed in the active region between the floating gate patterns by implanting the impurities without using the photoresist pattern.

The high concentration impurity region 35 and the impurity region 31 formed in the active region adjacent to the string selection gate pattern comprise a bit line contact region BC, which is exposed through a bit line contact hole that will be formed in a subsequent process. The high concentration impurity region 35 and the impurity region 31 formed in the active region adjacent to the ground selection gate pattern comprise the common source line CSL of FIG. 1. Here, a portion in which the impurity region 31 is overlapped with the high concentration impurity region 35 exhibits a structure of an LDD-type impurity region. In alternate embodiments, the spacer 33 and the high concentration impurity region 35 need not be formed.

Figure 7A:
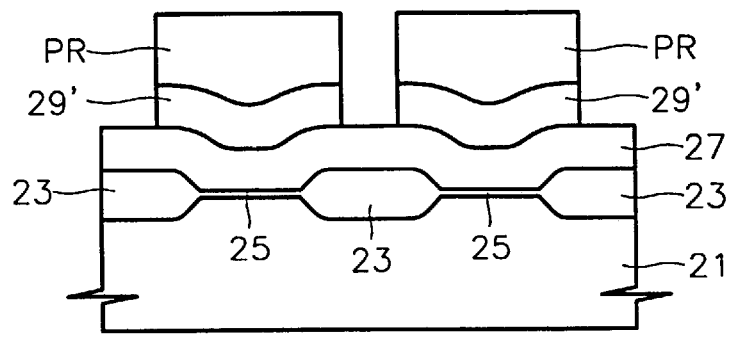
Figure 7B:
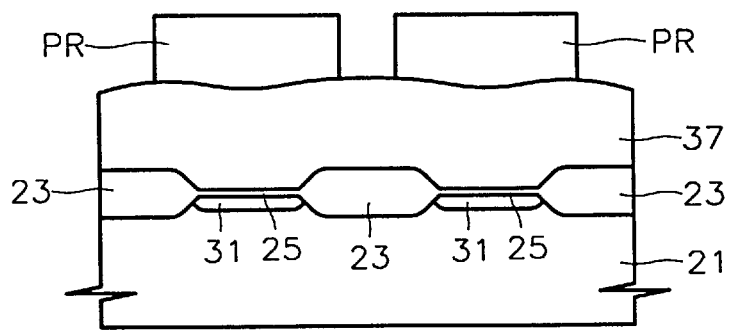
Figure 7C:
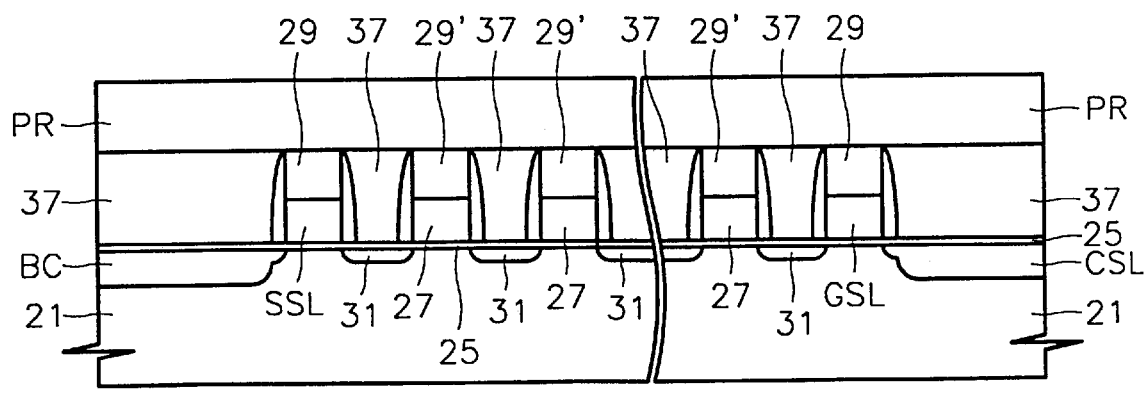

Referring to FIGS. 7A to 7C, an insulating film is formed over the entire surface of the semiconductor substrate including the impurity region 31 or the high concentration impurity region 35. It is preferable that the insulating film is formed by stacking an undoped silicate glass (USG) layer, which has an excellent planarization characteristic, and a plasma TEOS film, which has a denser film quality than the USG layer. The insulating film is then blanket etched using a chemical-mechanical polishing (CMP) process until the capping layer pattern 29 is exposed, thereby forming an insulating film pattern 37 that fills up the regions between the capping layer patterns 29.

A photoresist pattern PR is then formed over the semiconductor substrate 21 and the insulating film pattern 37, using a photo mask on which the floating gate isolation pattern FGI of FIG. 1 is engraved. The photoresist pattern PR opens a portion over the device isolation film 23 between the string selection line SSL and the ground selection line GSL, as shown in FIG. 1.

The capping layer pattern 29, which comprises the floating gate pattern, is then selectively etched using the photoresist pattern PR and the insulating film pattern 37 as an etching mask, thereby forming an isolated capping layer pattern 29' over the active region crossing the floating gate pattern. At this time, the device isolation film 23 between the floating gate patterns, as shown in FIG. 7B, is protected from the etching by the insulating film pattern 37. The capping layer patterns 29 that respectively comprise the string selection gate pattern and the ground selection gate pattern are also not etched.

Figure 8A:
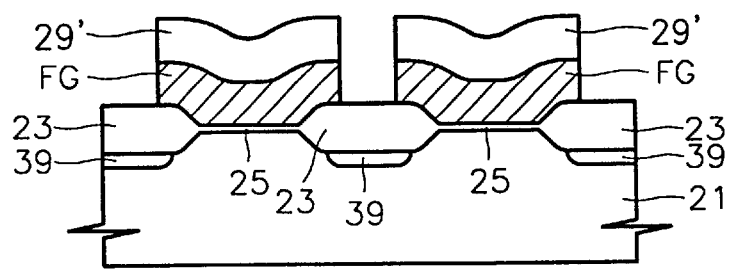
Figure 8B:
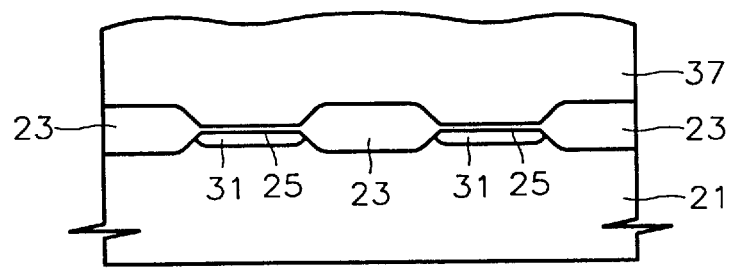
Figure 8C:
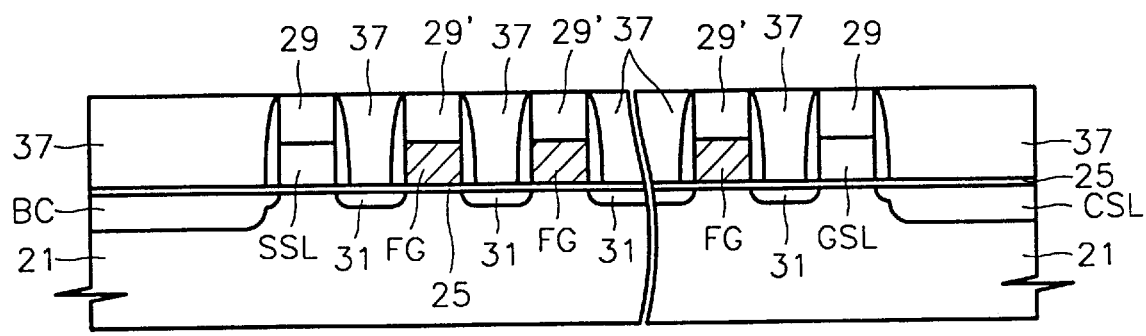

Referring to FIGS. 8A to 8C, the photoresist pattern PR is removed to expose the isolated capping layer pattern 29'. The conductive layer pattern 27 exposed between the isolated capping layer patterns 29 is then etched using the isolated capping layer pattern 29' and the insulating film pattern 37 as an etching mask, thereby forming a floating gate FG under each isolated capping layer pattern 29'. At this time, the string selection line SSL and the ground selection line GSL are not etched. Impurities of the same conductivity type as the semiconductor substrate 21 are then selectively implanted in the surface of the semiconductor substrate 21 under the device isolation film 23 and between the floating gates FG. This implantation is performed using the isolated capping layer pattern 29' and the insulating film pattern 37 as an ion-implantation mask, and results in the formation of a channel stop impurity region 39. Preferably, the channel stop impurity region 39 is formed by implanting boron (B) ions at a dose of about $2\times10^{13}$ ion atoms/cm$^2$. The ion-implantation energy is determined in consideration of the thickness of the device isolation film 23.

Figure 9A:
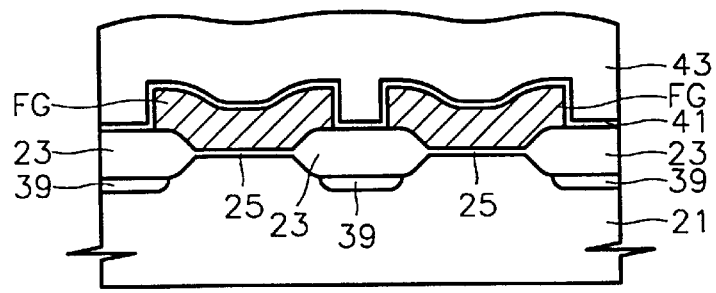
Figure 9B:
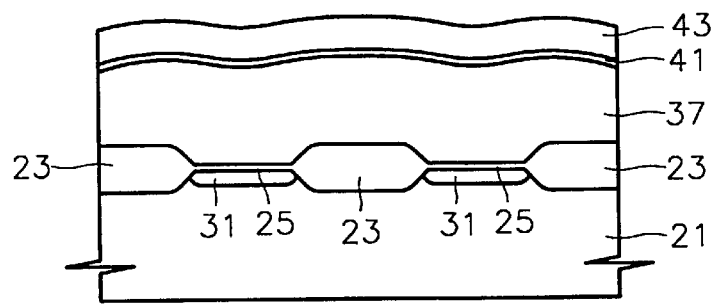
Figure 9C:
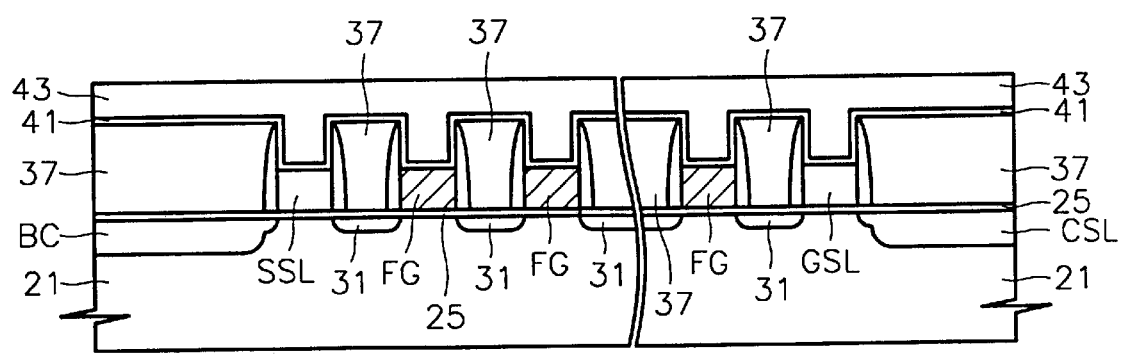

Referring to FIGS. 9A to 9C, the isolated capping layer pattern 29' and the capping layer pattern 29 are then removed, preferably with phosphoric acid ($H_3PO_4$), thereby exposing the string selection line SSL, the ground selection line GSL, and the floating gate FG. Arsenic (As) ions are then implanted in the entire surface of the semiconductor substrate having the exposed string selection line SSL, the ground selection line GSL, and the floating gate FG, to dope the string selection line SSL, the ground selection line GSL and the floating gate FG.

An inter-gate dielectric film 41 and a conductive layer 43 are then sequentially formed over the entire surface of the semiconductor substrate having the doped string selection line SSL, ground selection line GSL and floating gate FG. It is preferable that the inter-gate dielectric film 41 be formed of an oxide/nitride/oxide (O/N/O) film and that the conductive layer 43 be formed of a refractory metal polycide film comprising a polysilicon film and a refractory metal silicide film such as a tungsten silicide film.

Figure 10A:
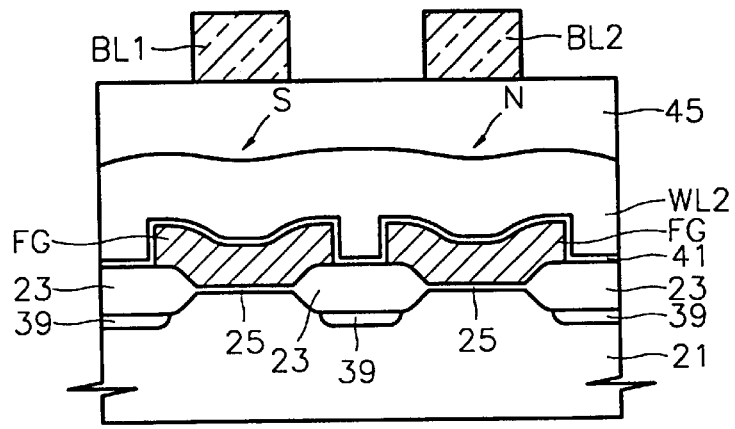
Figure 10B:
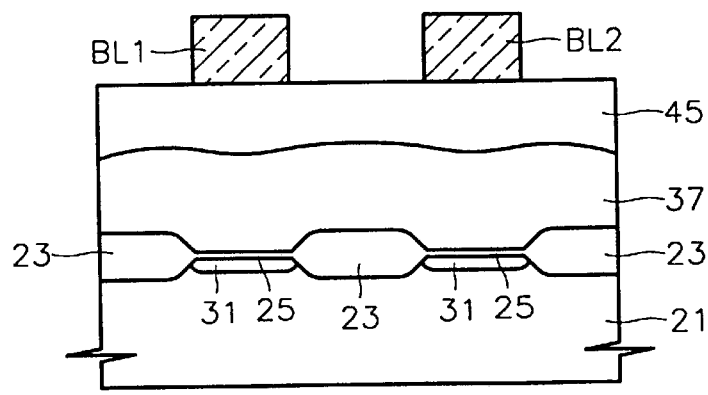
Figure 10C:
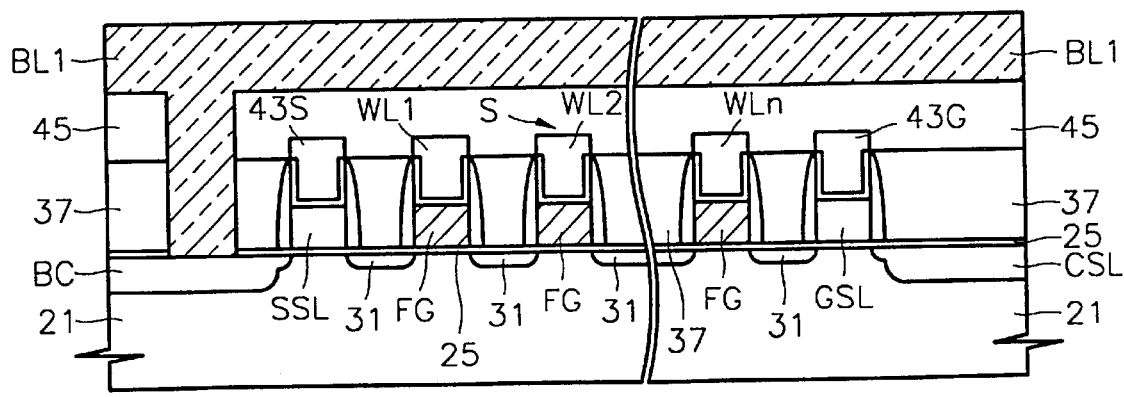

Referring to FIGS. 10A to 10C, the conductive layer 43 and the inter-gate dielectric film 41 are patterned using a photo mask on which the string selection line SSL, the plurality of word lines $WL_1$, $WL_2$, . . . , and $WL_n$, and the ground selection line GSL of FIG. 1 are engraved. This results in the formation of a string gate line 43S, a plurality of word lines $WL_1$, $WL_2$, . . . , and $WL_n$ and a ground gate line 43G, respectively, over the string selection line SSL, the plurality of floating gates FG, and the ground selection line GSL. The string gate line 43S, the plurality of word lines $W_1$, $WL_2$, . . . , and $WL_n$, and the ground gate line 43G are parallel to one another and are insulated from each other by the intergate dielectric film 41.

An interlayer insulating film 45, e.g., a plasma TEOS film is then formed over the entire surface of the semiconductor substrate including the string gate line 43S, the plurality of word lines $W_1$, $WL_2$, . . . , and $WL_n$, and the ground gate line 43G. The interlayer insulating film 45 and the insulating film pattern 37 are then consecutively patterned using a photo mask on which the contact CT of FIG. 1 is engraved, thereby forming a bit line contact hole exposing the bit line contact region BC adjacent to the string selection line SSL. A metal layer is then formed over the entire surface of the semiconductor substrate, including the bit line contact hole, to fill up the bit line contact hole. The metal layer is then patterned using a photo mask on which the bit lines $BL_1$ and $BL_2$ of FIG. 1 are engraved, thereby forming first and second bit lines $BL_1$ and $BL_2$.

According to the first preferred embodiment of the present invention, the device isolation film 23 between the impurity regions 31, as shown in FIG. 10B, is not etched. As a result, a device isolation characteristic between adjacent memory cells interleaved with the device isolation film 23 is not reduced. In particular, when a voltage corresponding to the general programming condition described in the prior art is applied to each control line shown in FIGS. 10A, 10B and 10C to program the selected memory cell S shown in FIGS. 1 and 10A, the device isolation characteristic is improved between the selected memory cell S and the unselected memory cell N, which is adjacent to the selected memory cell S across the device isolation film 23. This prevents the phenomenon of the unselected memory cell N being accidentally programmed.

Figure 11A:
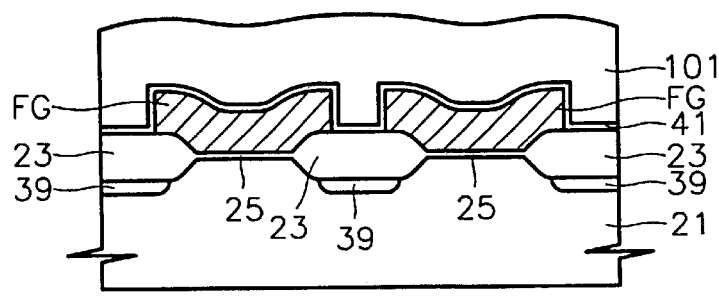
FIGS. 11A, 12A and 13A are sectional views taken along the line A–A' of FIG. 1, for explaining a method for fabricating a NAND-type flash memory device according to a second preferred embodiment of the present invention.
Figure 11B:
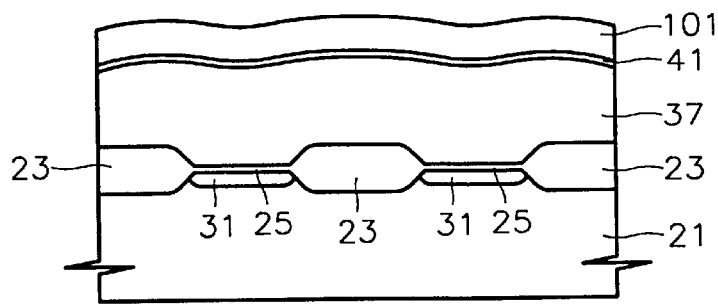
FIGS. 11B, 12B and 13B are sectional views taken along the line B–B' of FIG. 1, for explaining the method for fabricating the NAND-type flash memory device according to the second preferred embodiment of the present invention.
Figure 11C:
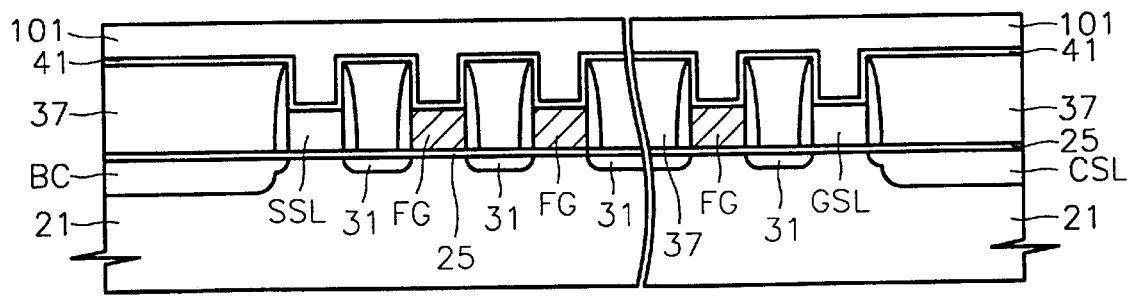
FIGS. 11C, 12C and 13C are sectional views taken along line the C–C' of FIG. 1, for explaining the method for fabricating the NAND-type flash memory device according to the second preferred embodiment of the present invention.
Figure 12A:
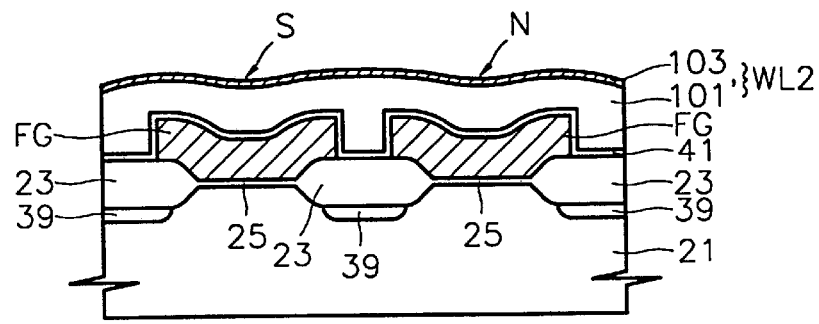
Figure 12B:
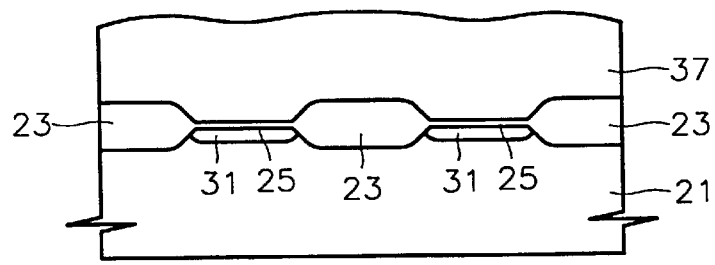
Figure 12C:
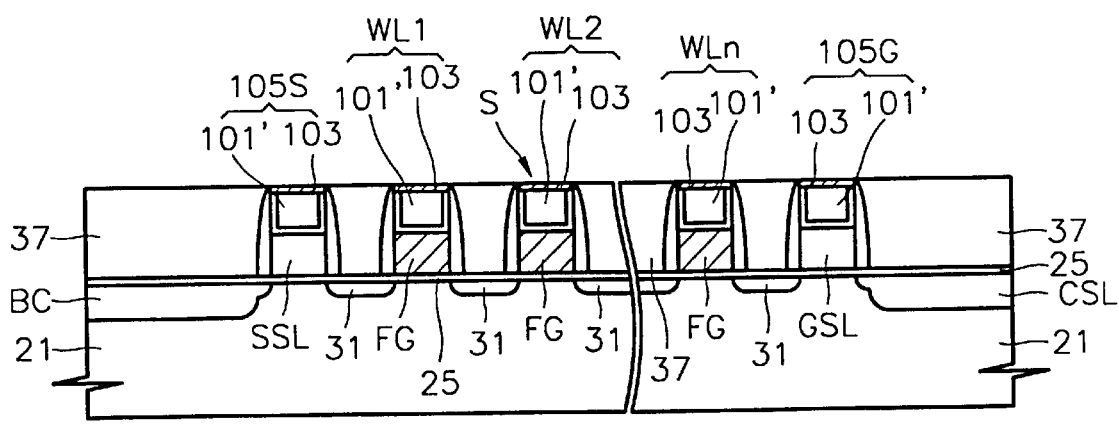
Figure 13A:
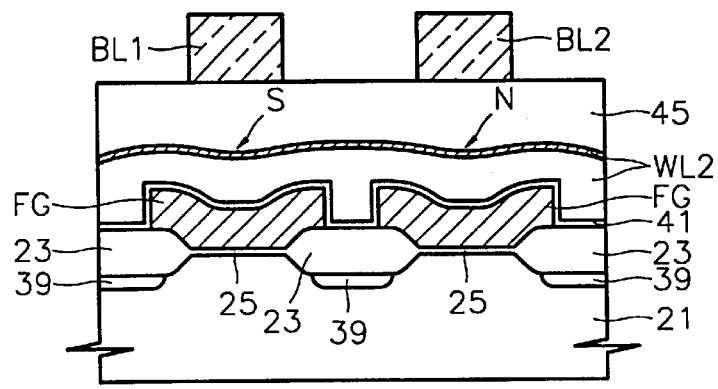
Figure 13B:
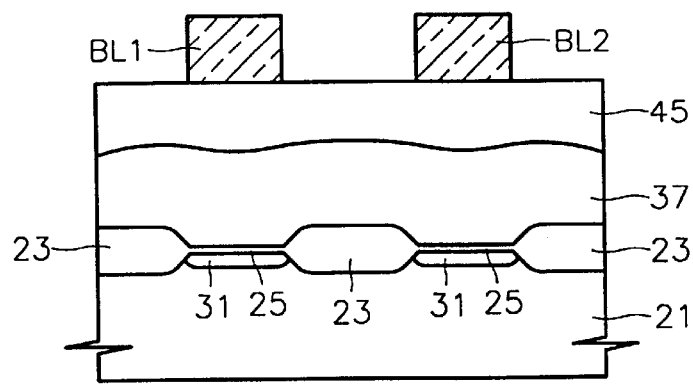
Figure 13C:
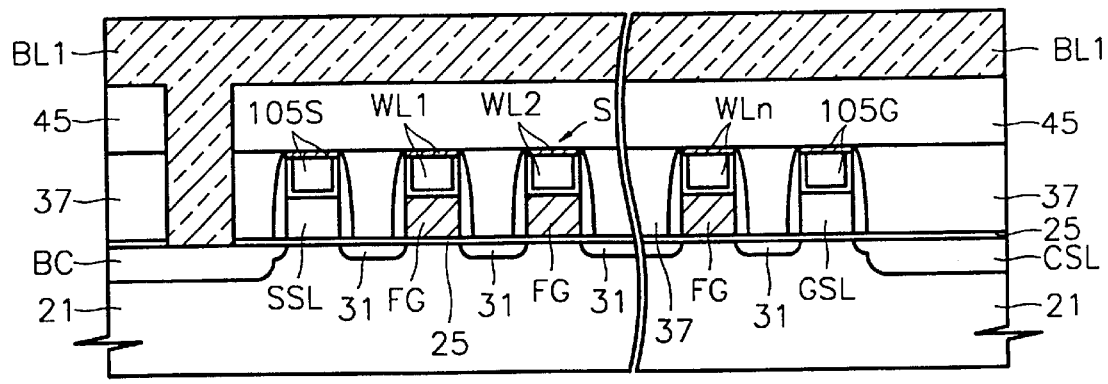

FIGS. 11A through 13C are sectional views for explaining a method for fabricating a flash memory device according to a second preferred embodiment of the present invention. FIGS. 11A, 12A and 13A are sectional views taken along the line A–A' of FIG. 1. FIGS. 11B, 12B and 13B are sectional views taken along the line B–B' of FIG. 1. FIGS. 11C, 12C and 13C are sectional views taken along the line C–C' of FIG. 1.

In the second preferred embodiment, the same steps as those in the foregoing embodiment described referring to FIGS. 5A through 8C are performed until the isolated capping layer pattern 29', the floating gate FG, and the channel stop impurity region 39 are formed. Therefore, those elements which are the same as those in the foregoing embodiment of the present invention are designated by the same reference numerals or characters.

Referring to FIGS. 11A through 11C, the isolated capping layer pattern 29' and the capping layer pattern 29 shown in FIGS. 8A through 8C are removed, preferably with phosphoric acid ($H_3PO_4$), to expose the string selection line SSL, the ground selection line GSL, and the floating gate FG. Arsenic (As) ions are then implanted in the entire surface of the semiconductor substrate where the string selection line SSL, the ground selection line GSL, and the floating gate FG have been exposed, thereby doping the string selection line SSL, the ground selection line GSL, and the floating gate FG. An inter-gate dielectric film 41 and a doped polysilicon film 101 are then formed sequentially over the entire surface of the semiconductor substrate where the string selection line SSL, the ground selection line GSL, and the floating gate FG have been doped.

Referring to FIGS. 12A through 12C, the doped polysilicon film 101 is blanket etched until the insulating film patterns 37 are exposed, thereby forming a plurality of polysilicon patterns 101' over regions between the insulating film patterns 37. Each polysilicon pattern 101' crosses the device isolation film 23 and the active region. A refractory metal silicide film 103, e.g., a titanium silicide film or a cobalt silicide film, is then selectively formed over only the surface of the plurality of polysilicon patterns 101'.

Preferably this done through the use of a general salicide process, i.e., a self-aligned silicide process. The general salicide process of forming the refractory metal silicide film 103 will now be specifically described. Primarily, a refractory metal film, e.g., a titanium (Ti) film or a cobalt (Co) film, is formed over the entire surface of the semiconductor substrate having the polysilicon pattern 101'. The refractory metal silicide film 103, e.g., the titanium silicide film or the cobalt silicide film is then formed selectively over only the surface of the plurality of polysilicon patterns 101', preferably by thermal-processing the semiconductor substrate having the refractory metal film. Unreacted refractory metal that remains on the surface of the insulating film pattern 37 is then removed with a chemical solution.

The polysilicon pattern 101' and the refractory metal silicide film 103 formed over the string selection line SSL comprise a string gate line 105S. The polysilicon pattern 101' and the refractory metal suicide film 103 formed over the ground selection line GSL comprise a ground gate line 105G. The polysilicon patterns 101' and the refractory metal silicide films 103 running over the floating gates FG comprise a plurality of word lines $W_1$, $WL_2$, . . . , and $WL_n$.

Referring to FIGS. 13A through 13C, the interlayer insulating film 45 described in the first preferred embodiment of the present invention is formed over the entire surface of the semiconductor substrate, including the refractory metal silicide film 103. Then, a contact hole exposing the bit line contact region BC and first and second bit lines $BL_1$ and $BL_2$ is formed by the same method as used in the first preferred embodiment of the present invention. In the second preferred embodiment, however, a word line that is self-aligned with each floating gate can be formed.

Figure 14A:
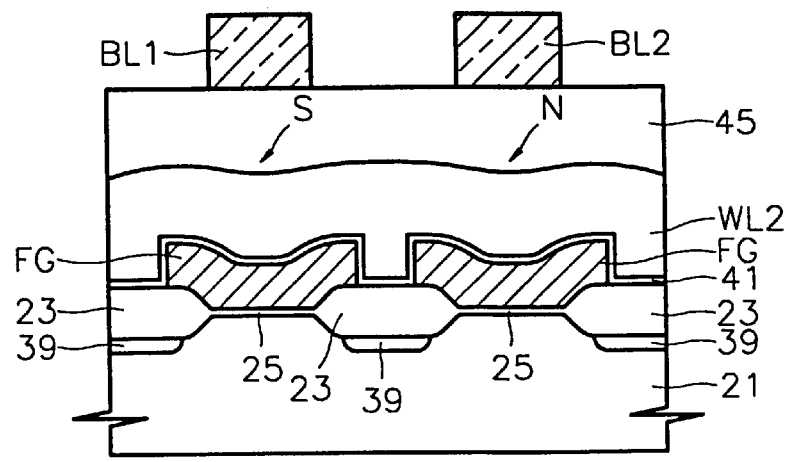
FIGS. 14A through 14C are sectional views respectively taken along the lines A–A', B–B' and D–D', for explaining a flash memory device according to a first preferred embodiment of the present invention.
Figure 14B:
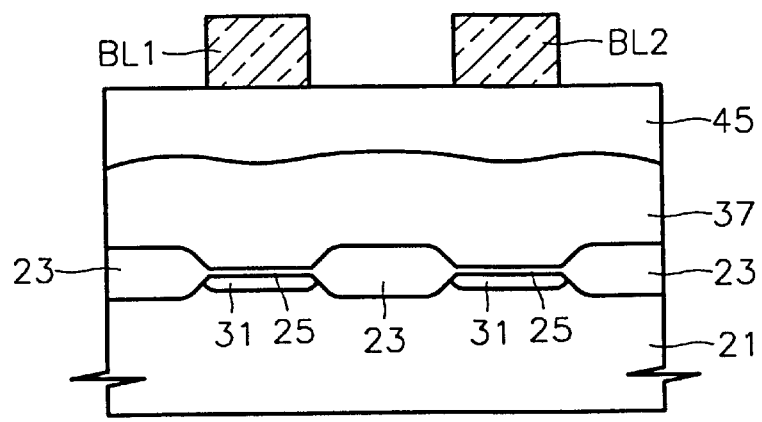
Figure 14C:
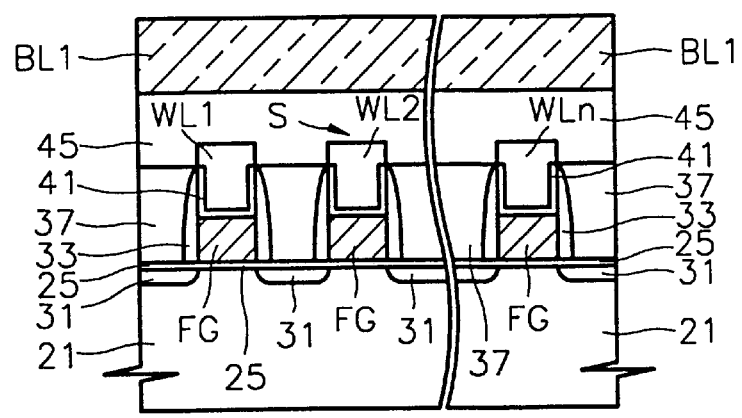

FIGS. 14A through 14C are sectional views for explaining a flash memory device according to the first preferred embodiment of the present invention. FIG. 14A is a sectional view taken along the line A—A of FIG. 1. FIG. 14B is a sectional view taken along the line B–B' of FIG. 1. FIG. 14C is a sectional view taken along the line D –D' of FIG. 1.

Referring to FIGS. 14A through 14C, a device isolation film 23 that defines an active region is formed over a predetermined region of a semiconductor substrate 21. A tunnel insulating film 25 is then formed over the active region between the device isolation films 23. A plurality of floating gates FG are then formed over predetermined regions of the tunnel insulating film 25. Each floating gate FG preferably extends over the edges of the device isolation films 23 adjacent to the predetermined region of the tunnel insulating film 25. Each floating gate is also preferably thicker than the device isolation film 23.

An inter-gate dielectric film 41 is then formed over each floating gate FG. A plurality of word lines $W_1$, $WL_2$, . . . , and $WL_n$ are then formed in parallel in a direction in which they cross the device isolation film 23 and the active region. An impurity region 31 that is doped with impurities of a different conductivity type from the semiconductor substrate 21 is then formed in the surface of the active region along each side of each floating gate FG. The impurity region 31 can be formed as an LDD type by further including spacers 33 at the sidewalls of each floating gate FG and at the sidewalls of the word line stacked on each floating gate FG.

A channel stop impurity region 39 that is doped with impurities of the same conductivity type as the semiconductor substrate 21 may be further included under each device isolation film 23. A region between the plurality of word lines $W_1$, $WL_2$, . . . , and $WL_n$ is filled with an insulating film pattern 37. In addition, The inter-gate dielectric film 41 may be extended to cover the sidewalls of each word line. Each of the plurality of word lines $W_1$, $WL_2$, . . . , and $WL_n$ serves as a control gate electrode of a memory cell.

An interlayer insulating film 45 is formed over the plurality of word lines $W_1$, $WL_2$, . . . , and $WL_n$ and the insulating film pattern 37. A bit line $BL_1$, $BL_2$ is then disposed over the interlayer insulating film 45, crossing the plurality of word lines $W_2$, $WL_2$, . . . , and $WL_n$.

As described above, according to the first preferred embodiment of the present invention, the center of a device isolation film that isolates adjacent memory cells is as thick as or thicker than the edge of the device isolation film regardless of the thickness of a floating gate. Accordingly, the flash memory device according to the first preferred embodiment achieves the same effect as the first preferred embodiment described above with respect to FIGS. 10A through 10C.

According to the present invention as described above, a device isolation film between adjacent memory cells is prevented from being etched regardless of the thickness of a conductive layer used to form a floating gate. As a result, even though the thickness of the floating gate may be increased, the device isolation characteristic of adjacent memory cells, between which the device isolation film is interleaved, are not reduced.

In addition, a coupling ratio of the memory cell can also be increased. The coupling ratio of a memory cell means the ratio of a voltage induced in the floating gate to a voltage applied to the word line while a predetermined voltage is being applied to the control gate electrode, i.e., the word line. As can be seen in FIGS. 10A and 12A, this is because an area where the floating gate is overlapped with a word line is increased.

Accordingly, if the coupling ratio is increased, the program efficiency and the erase efficiency of the memory cell also increases. In other words, if the coupling ratio is increased, a programming voltage that should be applied to program the memory cell decreases. Consequently, according to the present invention, not only is the device isolation characteristic of the memory cell improved but also the program efficiency is enhanced.

Furthermore, as the coupling ratio increases, an electric field applied to an intergate dielectric film interposed between the word line and the floating gate also decreases. As a result of this, the leakage current characteristic and the allowable margin of breakdown voltage of the inter-gate dielectric film are both improved. Therefore, if the thickness of the inter-gate dielectric film is further decreased, the coupling ratio of the memory cell can be further increased.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a flash memory device, comprising:

forming a device isolation film over a predetermined region of a semiconductor substrate to define a plurality of active regions;

forming a tunnel insulating film over the active regions;

forming a plurality of floating gate patterns in parallel, such that they cross the device isolation film and the active regions, each of the plurality of floating gate patterns comprising a conductive layer pattern and a capping layer pattern that are sequentially stacked;

forming a plurality of impurity regions of a different conductivity type from that of the semiconductor substrate in a portion of the active region between the plurality of floating gate patterns;

forming an insulating film pattern to fill up regions between the plurality of floating gate patterns;

forming a plurality of floating gates and isolated capping layers that are sequentially stacked over respective active regions by selectively etching a predetermined region of each floating gate pattern to expose a portion of the device isolation film beneath each floating gate pattern;

exposing each floating gate by removing the isolated capping layers;

forming an inter-gate dielectric film over the exposed floating gate and the exposed device isolation film; and forming a plurality of word lines over the inter-gate dielectric film, such that each word line crosses the device isolation film and the active regions.

2. A method for fabricating a flash memory device, as recited in claim 1, wherein the impurity region is formed by implanting phosphorus (P) or arsenic (As) ions at a dose of between $1 \times 10^{13}$ ion atoms/cm$^2$ to $1 \times 10^{14}$ ion atoms/cm$^2$.

3. A method for fabricating a flash memory device, as recited in claim 1, further comprising forming spacers at sidewalls of the floating gate patterns.

4. A method for fabricating a flash memory device, as recited in claim 3, further comprising forming a high concentration impurity region by implanting arsenic (As) ions at a dose of between $1 \times 10^{15}$ ion atoms/cm$^2$ to $5 \times 10^{15}$ ion atoms/cm$^2$ in the impurity region, using the spacers and the floating gate pattern as an ion-implantation mask, after forming the spacers.

5. A method for fabricating a flash memory device, as recited in claim 1, wherein the forming of the insulating film pattern comprises:

forming an insulating film over the impurity regions; and blanket-etching the insulating film until the capping layer pattern in the floating gate pattern is exposed.

6. A method for fabricating a flash memory device, as recited in claim 1, further comprising forming a channel stop impurity region by implanting impurities of the same conductivity type as the semiconductor substrate in the semiconductor substrate under the exposed device isolation film, after forming the floating gates and isolated capping layers.

7. A method for fabricating a flash memory device, as recited in claim 1, wherein the forming of the plurality of word lines comprises:

forming a conductive layer over portions of the semiconductor substrate from which the isolated capping layers have been removed; and forming a plurality of conductive layer patterns insulated by the inter-gate dielectric film over the floating gate and the device isolation film adjacent to the floating gate by patterning the conductive layer and the inter-gate dielectric film to expose the insulating film pattern, wherein the plurality of conductive layer patterns are formed in parallel in a direction in which the plurality of conductive layer patterns cross the device isolation film.

8. A method for fabricating a flash memory device, as recited in claim 7, wherein the conductive layer comprises tungsten polycide.

9. A method for fabricating a flash memory device, as recited in claim 1, wherein the forming of the plurality of word lines comprises:

forming a polysilicon film over portions of the semiconductor substrate from which the isolated capping layers have been removed;

forming a plurality of polysilicon patterns insulated by the inter-gate dielectric film over the floating gate and the device isolation film adjacent to the floating gate by blanket-etching the polysilicon film until the insulating film pattern is exposed, wherein the plurality of polysilicon patterns are formed in parallel in a direction in which the plurality of polysilicon patterns cross the device isolation film; and selectively forming a refractory metal silicide film over the plurality of polysilicon patterns.

10. A method for fabricating a flash memory device, as recited in claim 1, further comprising:

forming an interlayer insulating film over the semiconductor substrate and the plurality of word lines;

forming a bit line contact hole exposing a predetermined region of the active region by patterning the interlayer insulating film; and forming a bit line over the interlayer insulating film, the bit line being electrically connected to the exposed active region through the bit line contact hole.

* * * * *